US012641956B2

(12) United States Patent
Aoki et al.

(10) Patent No.: US 12,641,956 B2
(45) Date of Patent: May 26, 2026

(54) DISPLAY DEVICE

(71) Applicant: Magnolia White Corporation, Tokyo (JP)

(72) Inventors: Yoshinori Aoki, Tokyo (JP); Akihiro Ogawa, Tokyo (JP); Masanobu Ikeda, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 554 days.

(21) Appl. No.: 18/098,740

(22) Filed: Jan. 19, 2023

(65) Prior Publication Data

US 2023/0157075 A1 May 18, 2023

Related U.S. Application Data

(63) Continuation of application No. PCT/JP2021/018773, filed on May 18, 2021.

(30) Foreign Application Priority Data

Jul. 20, 2020 (JP) ................................. 2020-123528

(51) Int. Cl.
*H10K 59/121* (2023.01)
*H10K 59/126* (2023.01)
*H10K 59/131* (2023.01)

(52) U.S. Cl.
CPC ....... *H10K 59/1213* (2023.02); *H10K 59/126* (2023.02); *H10K 59/131* (2023.02)

(58) Field of Classification Search
None
See application file for complete search history.

(56) References Cited

U.S. PATENT DOCUMENTS

2011/0062458 A1* 3/2011 Shimoda .............. H10K 50/865
                                                      257/E33.056
2015/0311351 A1   10/2015 Seko et al.

FOREIGN PATENT DOCUMENTS

JP          4599655 B2 * 12/2010
JP          6577224 B2 *  9/2019 ......... H10K 59/1216
JP      2020-052154 A     4/2020
JP      2020-052155 A     4/2020
JP       2020154096 A *  9/2020 ........... H10D 86/481

OTHER PUBLICATIONS

International Search Report mailed Jul. 20, 2021, for the corresponding PCT Application No. PCT/JP2021/018773, with English translation.
Japanese Office Action mailed on Apr. 9, 2024 for the corresponding Japanese Patent Application No. 2020-123528 with English machine translation.

* cited by examiner

*Primary Examiner* — Hung K Vu
(74) *Attorney, Agent, or Firm* — Michael Best & Friedrich LLP

(57) ABSTRACT

According to one embodiment, a display device comprises an insulating base, a light-emitting element, a pixel circuit including a first transistor, and a first shield that shields a part of the pixel circuit from light. The first transistor includes a first semiconductor layer, and a first gate electrode between the insulating base and the first semiconductor layer. The first shield is disposed between the insulating base and the first gate electrode in the thickness direction and overlaps a channel region where the first semiconductor layer and the first gate electrode intersect.

8 Claims, 9 Drawing Sheets

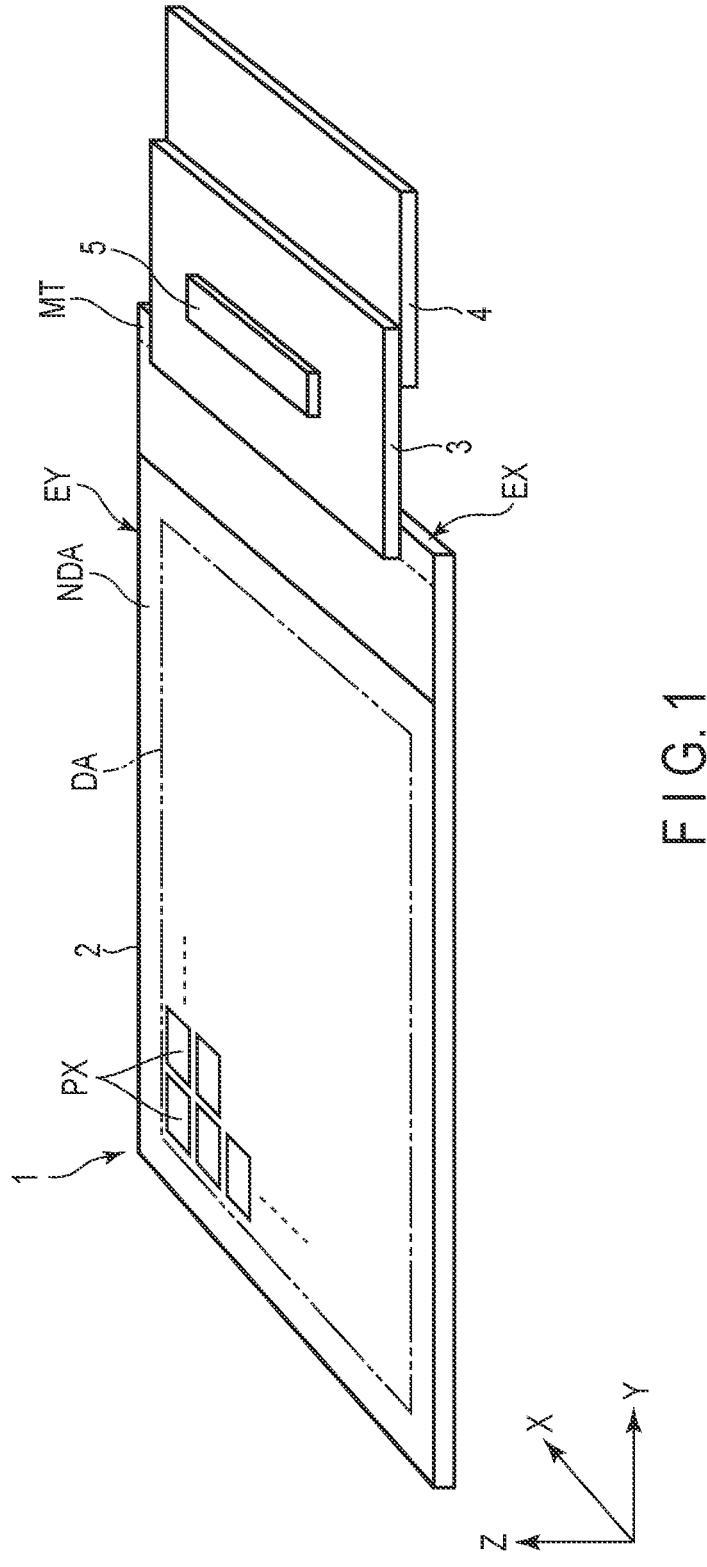
F I G. 1

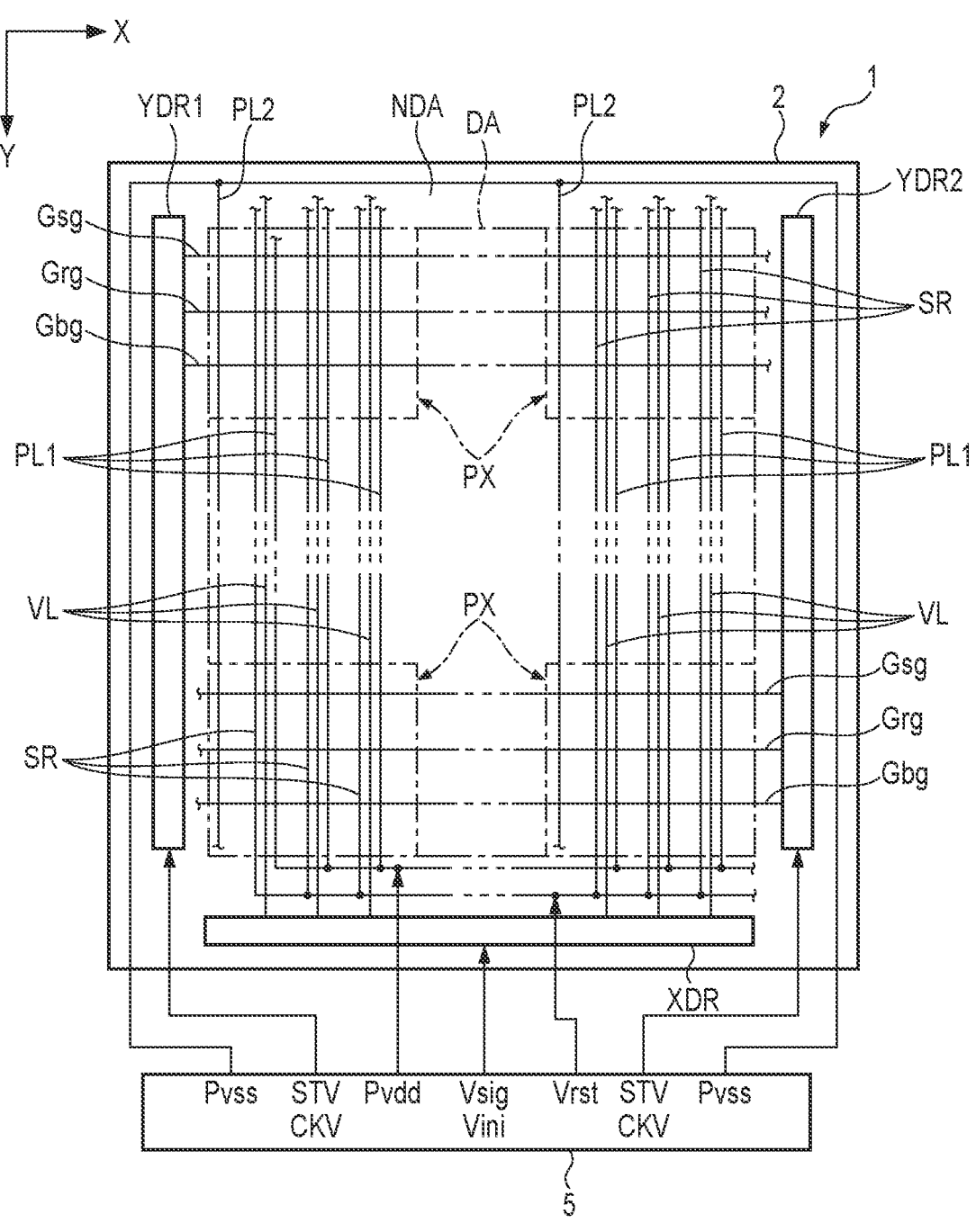
F I G . 2

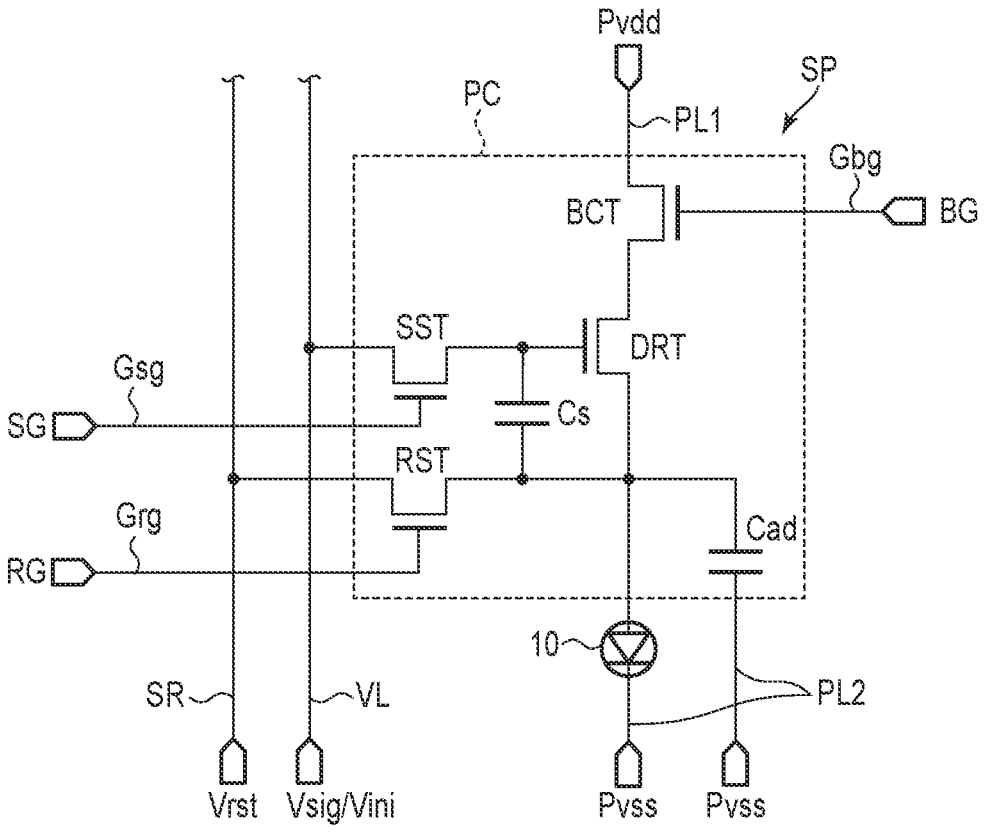
F I G. 3

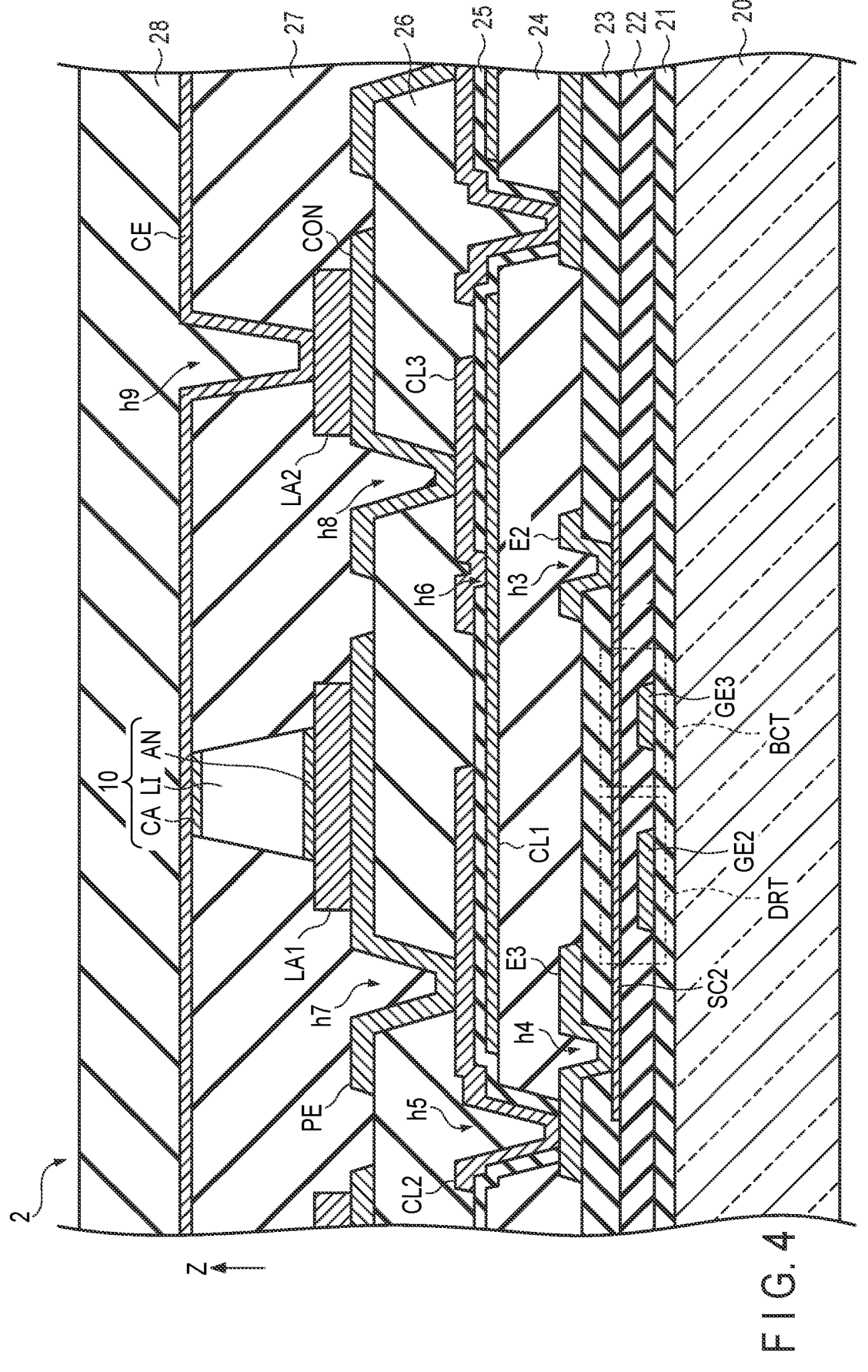
F I G. 4

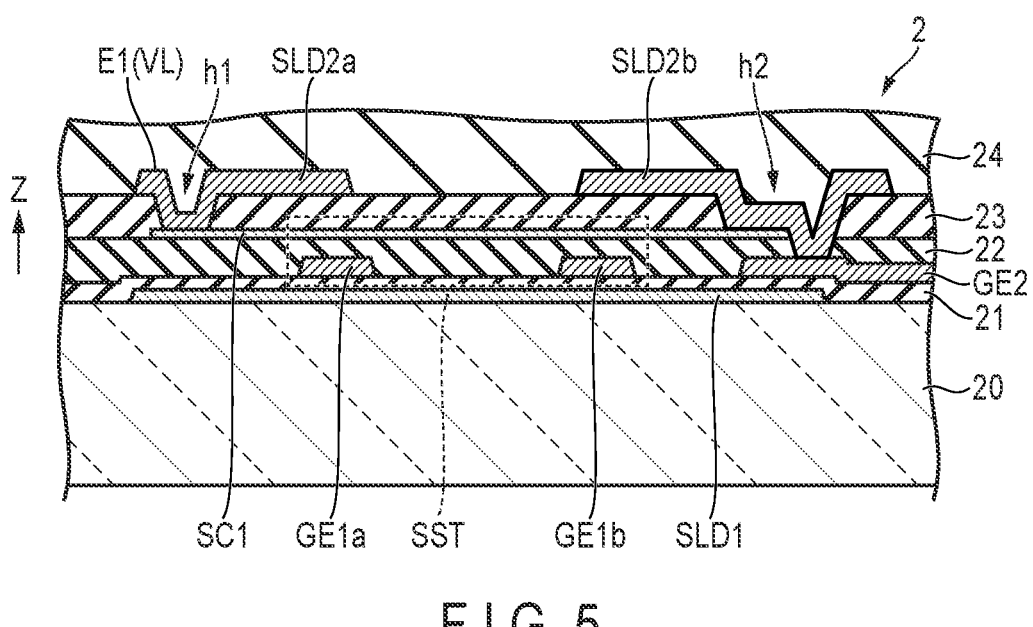
F I G. 5
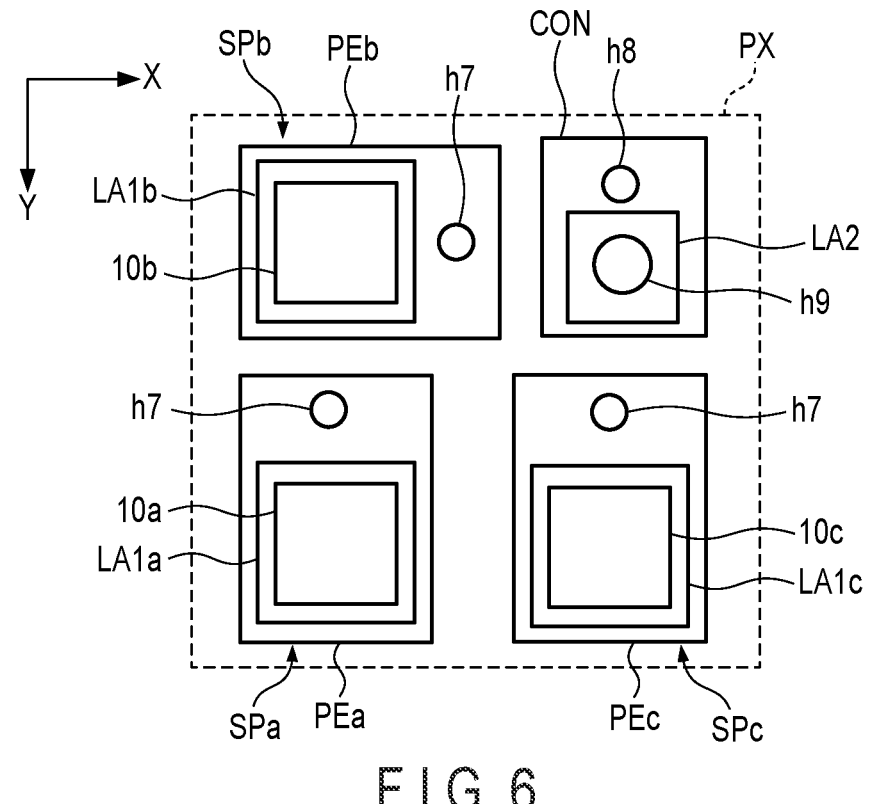
F I G. 6

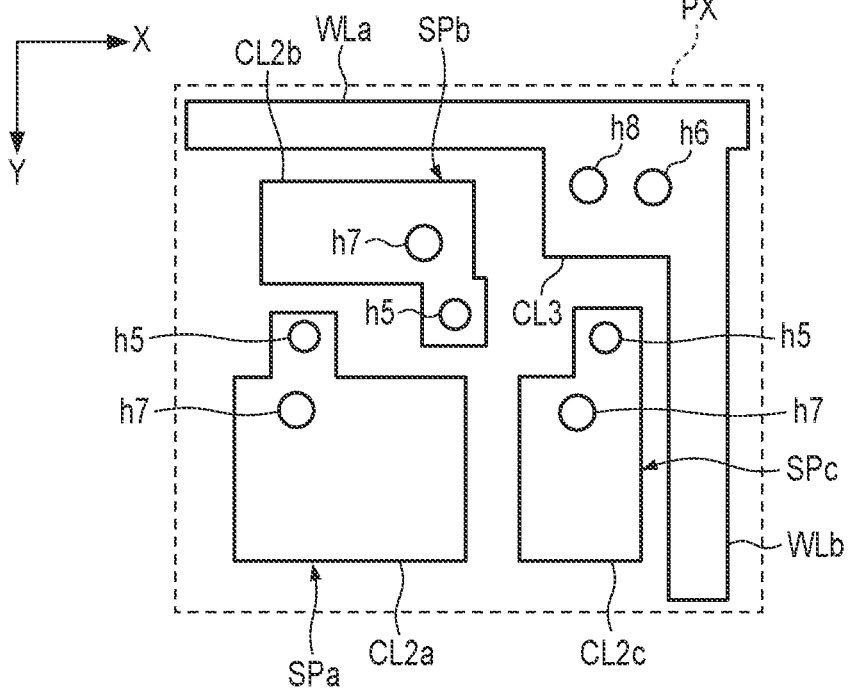
F I G. 7

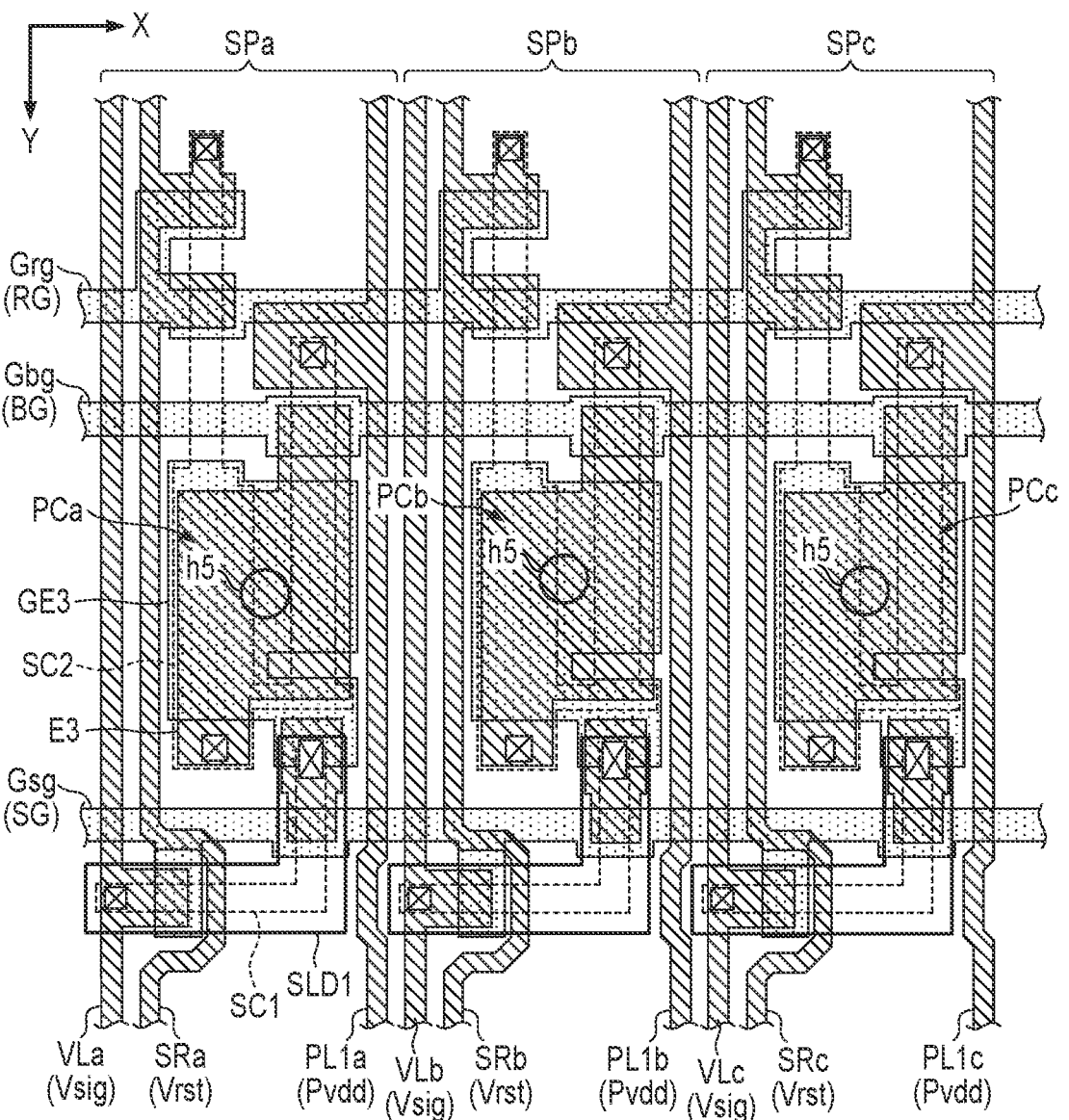
F I G. 8

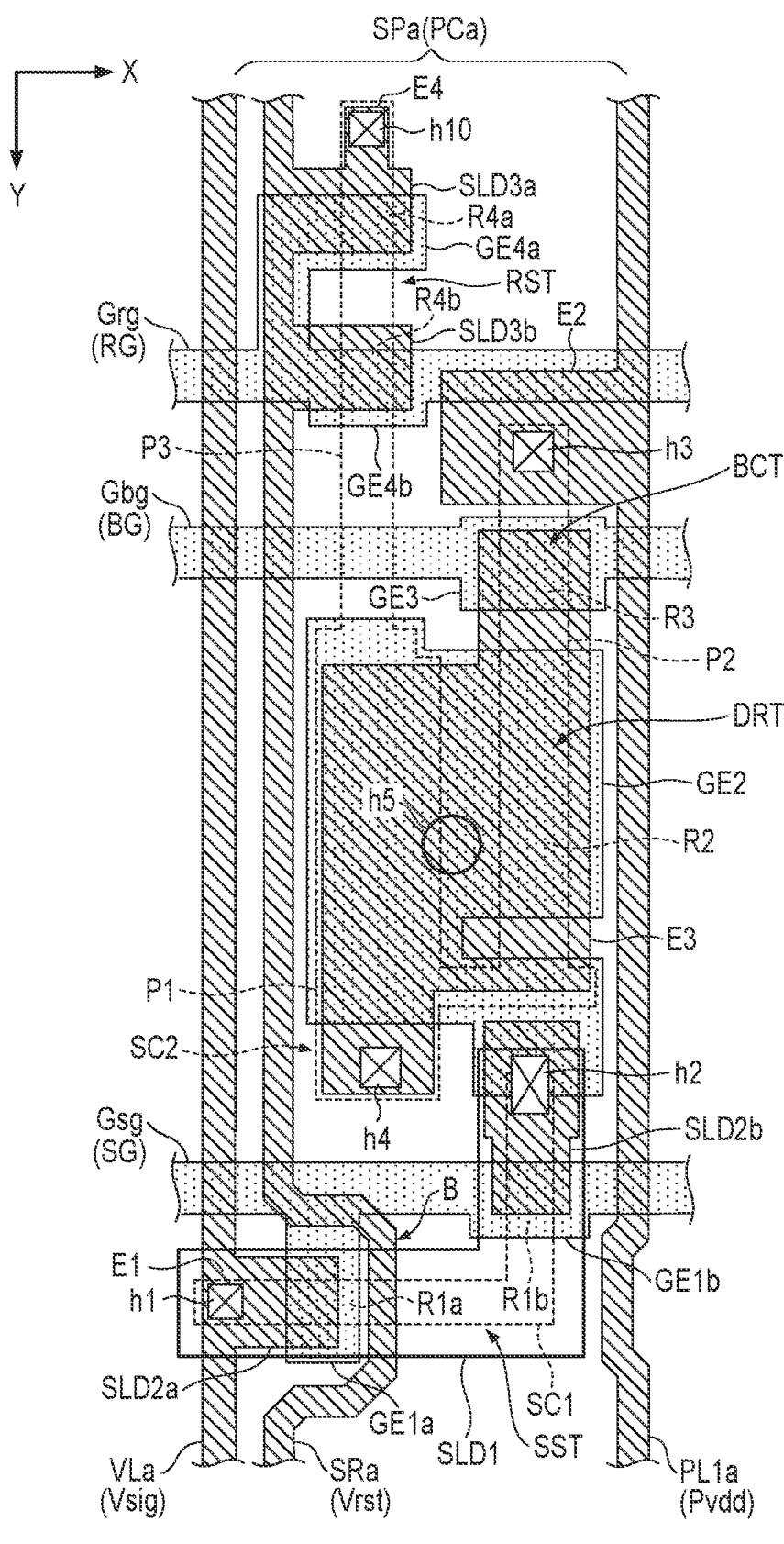
F I G. 9

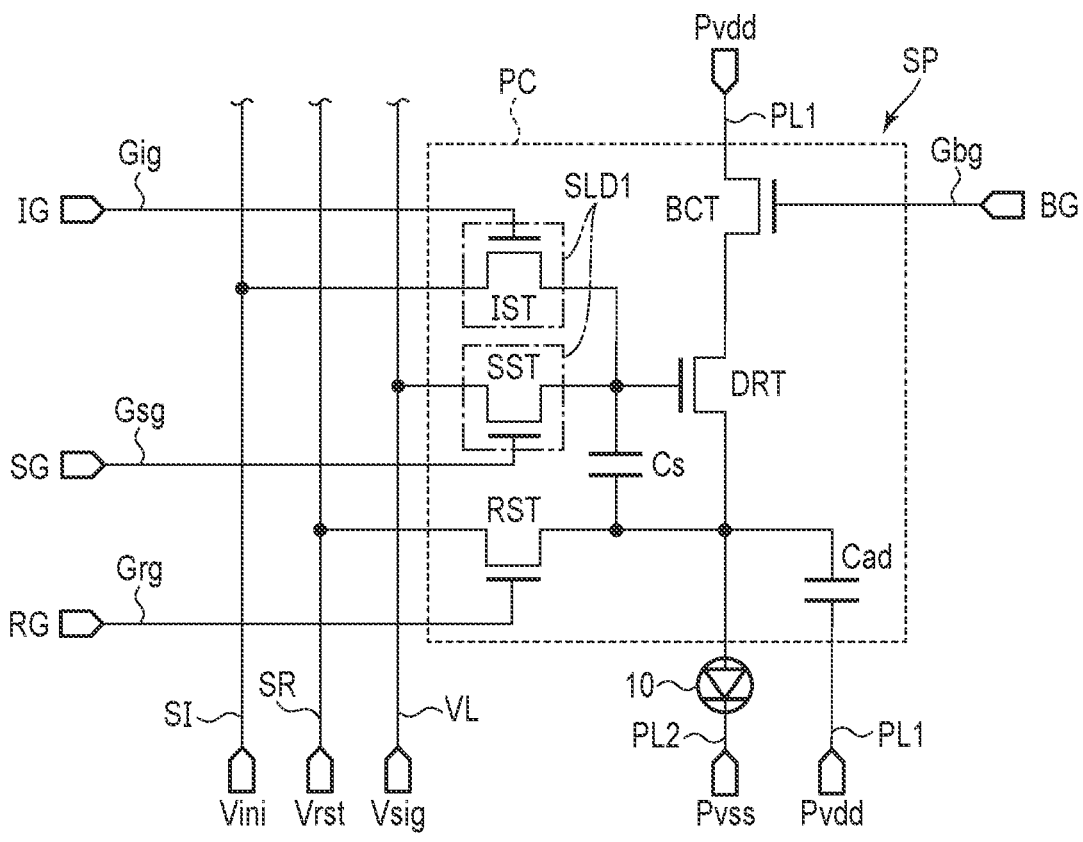
F I G. 10
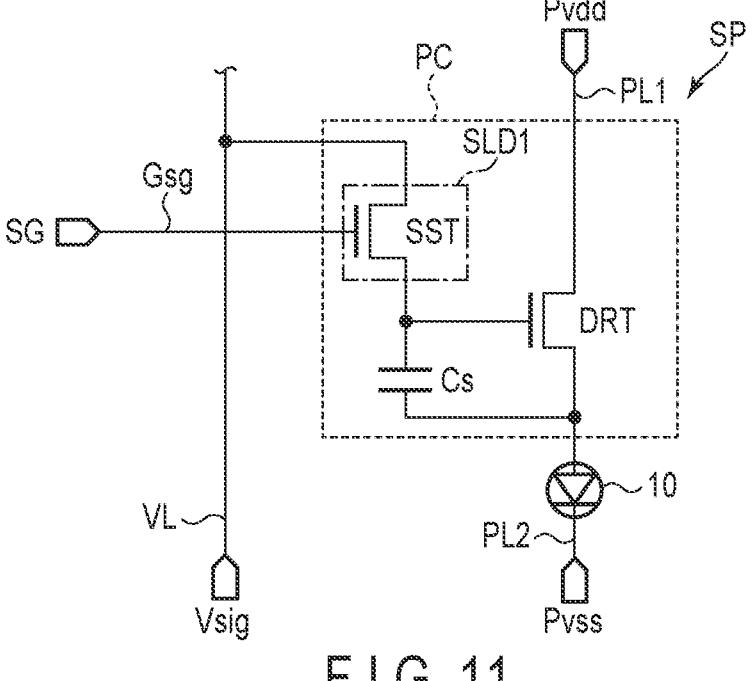
F I G. 11

DISPLAY DEVICE

CROSS-REFERENCE TO RELATED APPLICATIONS

This application is a Continuation Application of PCT Application No. PCT/JP2021/018773 filed May 18, 2021 and based upon and claiming the benefit of priority from Japanese Patent Application No. 2020-123528, filed Jul. 20, 2020, the entire contents of all of which are incorporated herein by reference.

FIELD

Embodiments described herein relate generally to a display device.

BACKGROUND

Display devices using light-emitting diodes (LEDs) as display elements are known. In recent years, display devices in which minute light-emitting diodes called micro-LEDs are mounted on an array substrate have also been developed. This type of display device is capable of displaying high-quality images and is attracting attention as a next-generation display device.

In the case where the viewing angle of a self-illuminated display element such as a micro-LED is large, light directed toward the back of the display device and its reflected light are also irradiated on pixel circuits used to drive the display element. If a light leakage current is generated in transistors included in the pixel circuits due to such light, the luminance of the display device is reduced.

BRIEF DESCRIPTION OF THE DRAWINGS

FIG. 1 is a schematic perspective view of a display device according to one embodiment.

FIG. 2 is a schematic circuit diagram of a display device according to one embodiment.

FIG. 3 shows an example of an equivalent circuit of a sub-pixel according to one embodiment.

FIG. 4 is a schematic cross-sectional view of a display panel according to one embodiment.

FIG. 5 is another schematic cross-sectional view of a display panel according to one embodiment.

FIG. 6 is a schematic plan view of elements included in a pixel according to one embodiment.

FIG. 7 is a schematic plan view of other elements included in a pixel according to one embodiment.

FIG. 8 is a schematic plan view of yet other elements included in a pixel according to one embodiment.

FIG. 9 is a schematic plan view in which a pixel circuit shown in FIG. 8 is enlarged.

FIG. 10 shows an example of an equivalent circuit of a sub-pixel according to a second embodiment.

FIG. 11 shows an example of an equivalent circuit of a sub-pixel according to a third embodiment.

DETAILED DESCRIPTION

In general, according to one embodiment, a display device comprises an insulating base, a light-emitting element disposed on the insulating base, a pixel circuit including a first transistor disposed between the insulating base material and the light-emitting element in a thickness direction of the insulating base and driving the light-emitting element, and a first shield that shields a part of the pixel circuit from light. The first transistor includes a first semiconductor layer, and a first gate electrode disposed between the insulating base and the first semiconductor layer in the thickness direction and intersecting the first semiconductor layer. The first shield is disposed between the insulating base and the first gate electrode in the thickness direction and overlaps a channel region where the first semiconductor layer and the first gate electrode intersect.

According to such a configuration, a display device capable of achieving high luminance can be provided.

Some embodiments will be described with reference to the drawings.

Note that the disclosure is only an example, and any modification that can be easily conceived by a person skilled in the art, while maintaining the main purpose of the invention, is naturally included in the scope of the invention. In addition, the drawings may be schematically represented in comparison with the actual state in order to clarify the explanation, but this is only an example and does not limit the interpretation of the invention. In each drawing, symbols may be omitted for the same or similar elements arranged consecutively. In addition, in the present specification and in each drawing, components that perform the same or similar functions as those described above with respect to the drawings already shown may be denoted by the same reference symbols, and redundant detailed descriptions may be omitted.

In each embodiment, as an example, a self-luminous type display device with LED elements is disclosed. However, each embodiment does not preclude the application of individual technical ideas disclosed in each embodiment to a display device having other types of display elements, such as organic electroluminescent elements, for example.

First Embodiment

FIG. 1 is a schematic view of a display device 1 according to a first embodiment. In the following description, a first direction X, a second direction Y, and a third direction Z are defined as shown in the drawing. These directions X, Y, and Z are orthogonal to each other; however, may intersect at an angle other than 90°. In the present embodiment, viewing the display unit 1 and its components along the third direction Z is referred to as a plan view. Also, the third direction Z may be referred to as up, and the opposite direction to the third direction Z may be referred to as down.

The display device 1 comprises a display panel 2, a first circuit board 3, a second circuit board 4, and a controller 5. In the example shown in FIG. 1, the display panel 2 is a rectangular shape having a short side EX parallel to the first direction X and a long side EY parallel to the second direction Y. The third direction Z corresponds to a thickness direction of the display panel 2.

The display panel 2 includes a display area DA for displaying images and a non-display area NDA (peripheral area) around the display area DA. The non-display area NDA includes a terminal area MT along the short side EX. Although the display area DA is rectangular in the present embodiment, the display area DA may also have other shapes. In the display area DA, a plurality of pixels PX are arranged in a matrix in the first direction X and the second direction Y.

The first circuit board 3 is mounted on the terminal area MT and electrically connected to the display panel 2. The second circuit board 4 is electrically connected to the first circuit board 3. The first circuit board 3 is, for example, a flexible circuit board (FPC). The second circuit board 4 is, for example, a printed circuit board (PCB). The controller 5 is, for example, an integrated circuit (IC). In the example shown in FIG. 1, the controller 5 is mounted on the first circuit board 3. However, the controller 5 may also be mounted under the first circuit board 3, in the non-display area NDA, or on the second circuit board 4.

The controller 5 is connected to a control board (not shown) via, for example, the second circuit board 4. The controller 5 drives a plurality of pixels PX based on video signals output from the control board.

FIG. 2 is a schematic circuit diagram of the display device 1 according to the present embodiment. The display panel 2 comprises a video driver XDR, a first scanning driver YDR1, and a second scanning driver YDR2 in the non-display area NDA. The video driver XDR extends in the first direction X. The scanning drivers YDR1 and YDR2 extend in the second direction Y. The display area DA is located between the scanning drivers YDR1 and YDR2.

The display panel 2 has multiple types of lines in the display area DA. These lines include a plurality of scanning lines Gsg, Grg, and Gbg, a plurality of video lines VL, a plurality of power lines PL1, a plurality of power lines PL2, and a plurality of reset lines SR.

The scanning lines Gsg, Grg, and Gbg extend in the first direction X and are connected to the scanning drivers YDR1 and YDR2. For example, among the pixels PX lined up in the second direction Y, the scanning lines Gsg, Grg, and Gbg for driving even-numbered pixels PX are connected to the first scanning driver YDR1, and the scanning lines Gsg, Grg, and Gbg for driving odd-numbered pixels PX are connected to the second scanning driver YDR2. As another example, for example, all of the scanning lines Gsg and Grg may be connected to the first scanning driver YDR1, and all of the scanning lines Gbg may be connected to the second scanning driver YDR2, i.e., one of the scanning lines Gsg, Grg, and Gbg may be connected to the first scanning driver YDR1, and the rest may be connected to the second scanning driver YDR2.

The video lines VL, the power lines PL1 and PL2, and the reset lines SR extend in the second direction Y. The video lines VL are connected to the video driver XDR. A video signal Vsig and an initialization signal Vini are supplied to the video lines VL from the video driver XDR. A high potential Pvdd is supplied to the power line PL1 from the controller 5. A low potential Pvss, which is lower than the high potential Pvdd, is supplied to the power line PL2 from the controller 5. A reset signal Vrst is supplied to the reset line SR from the controller 5.

The controller 5 also outputs start pulse signals STV and clock signals CKV to the scanning drivers YDR1 and YDR2. The scanning drivers YDR1 and YDR2 include multiple shift register circuits, transfer start pulse signals STV sequentially to the shift register circuits in the next stage according to the clock signals CKV, and supply control signals sequentially to each of the scanning lines Gsg, Grg, and Gbg.

FIG. 3 shows an example of an equivalent circuit of a sub-pixel SP included in a pixel PX. The sub-pixel SP comprises a light-emitting element 10 and a pixel circuit PC that drives the light-emitting element 10. In the present embodiment, it is assumed that the light-emitting element 10 is a micro light-emitting diode (micro-LED). In other words, the display device 1 is a micro-LED display device.

As an example, in the light-emitting element 10 that is a micro-LED, the length of a longest side is 100 μm or less. However, the light-emitting element 10 may be a mini-LED whose longest side has a length of, for example, more than 100 μm but less than 300 μm. The light-emitting element 10 may also be an LED whose longest side has a length of 300 μm or more.

The pixel circuit PC controls the light-emitting element 10 according to the video signal Vsig supplied to the video lines VL. To realize such driving of the light-emitting element 10, the pixel circuit PC in the present embodiment includes a pixel selection transistor SST, a drive transistor DRT, an output transistor BCT, a reset transistor RST, a holding capacitance Cs, and an auxiliary capacitance Cad. The auxiliary capacitance Cad is an element provided to adjust the amount of light emission current and may be unnecessary in some cases. The pixel selection transistor SST is an example of a first transistor, and the drive transistor DRT is an example of a second transistor.

The pixel selection transistor SST, the drive transistor DRT, the output transistor BCT, and the reset transistor RST can be configured by, for example, an N-channel type TFT, but at least one of them may be configured by a P-channel type TFT.

In the present embodiment, the pixel selection transistor SST, the drive transistor DRT, the output transistor BCT, and the reset transistor RST are formed by the same process and in the same layer structure, and have a bottom-gate structure using polycrystalline silicon in the semiconductor layer. As another example, the pixel selection transistor SST, the drive transistor DRT, the output transistor BCT, and the reset transistor RST may have a top-gate structure. Note that oxide semiconductors or polycrystalline GaN semiconductors, etc., may also be used as the semiconductor layer.

The pixel selection transistor SST, the drive transistor DRT, the output transistor BCT, and the reset transistor RST include a first terminal, a second terminal, and a control terminal. In the description of FIG. 3, the first terminal is referred to as a source electrode, the second terminal is referred to as a drain electrode, and the control terminal is referred to as a gate electrode.

The drive transistor DRT and the output transistor BCT are connected in series with the light-emitting element 10 between the power line PL1 and the power line PL2. The high potential Pvdd supplied to the power line PL1 is set at, for example, 10 V, and the low potential Pvss supplied to power line PL2 is set at, for example, 1.5 V.

The drain electrode of the output transistor BCT is connected to the power line PL1. The source electrode of the output transistor BCT is connected to the drain electrode of the drive transistor DRT. The gate electrode of the output transistor BCT is connected to the scanning line Gbg. The output transistor BCT is turned on and off by a control signal BG supplied from the scanning line Gbg. Here, on represents a conducting state and off represents a non-conducting state. The output transistor BCT controls an emission time of the light-emitting element 10 based on the control signal BG.

The source electrode of the drive transistor DRT is connected to one electrode (here, an anode) of the light-emitting element 10. The other electrode of the light-emitting element 10 (here, a cathode) is connected to the power line PL2. The drive transistor DRT outputs a drive current in response to the video signal Vsig to the light-emitting element 10.

The source electrode of the pixel selection transistor SST is connected to the video line VL. The drain electrode of the pixel selection transistor SST is connected to the gate electrode of the drive transistor DRT. The gate electrode of the pixel selection transistor SST is connected to the scanning line Gsg functioning as a gate line for signal writing control. The pixel selection transistor SST is turned on and off by a control signal SG supplied from the scanning line Gsg to switch connection and disconnection between the pixel circuit PC and the video line VL. In other words, when the pixel selection transistor SST is turned on, the video signal Vsig or the initialization signal Vini of the video line VL is supplied to the gate electrode of the drive transistor DRT.

The source electrode of the reset transistor RST is connected to the reset line SR. The drain electrode of the reset transistor RST is connected to the source electrode of the drive transistor DRT and the anode of the light-emitting element 10. The gate electrode of the reset transistor RST is connected to the scanning line Grg functioning as a gate line for reset control. The reset transistor RST is turned on and off by a control signal RG supplied from the scanning line Grg. When the reset transistor RST is switched on, the source electrode of the drive transistor DRT and the potential of the anode of the light-emitting element 10 can be reset to the reset signal Vrst of the reset line SR. In other words, the reset line SR is a line for resetting a voltage of the light-emitting element 10.

The holding capacitance Cs is connected between the gate electrode and the source electrode of the drive transistor DRT. The auxiliary capacitance Cad is connected between the source electrode of the drive transistor DRT and the power line PL2.

In the configuration described above, the pixel circuit PC is driven by the control signals SG, RG, and BG supplied to the scanning lines Gsg, Grg, and Gbg, and the light-emitting element 10 emits light with the luminance corresponding to the video signal Vsig of the video line VL.

Based on the above-mentioned start pulse signal STV and clock signal CVK, the scanning drivers YDR1 and YDR2 sequentially supply the control signals SG, RG, and BG to the scanning lines Gsg, Grg, and Gbg of each line (a series of sub-pixels SP lined up in the first direction X). In addition, based on the signals supplied from the controller 5 shown in FIG. 2, the video driver XDR sequentially supplies the video signal Vsig and the initialization signal Vini to each video line VL. The electric charge held in the holding capacitance Cs with the supply of the video signal Vsig is initialized with the supply of the initialization signal Vini.

FIG. 4 and FIG. 5 are schematic cross-sectional views of the display panel 2. FIG. 4 shows a structure including the drive transistor DRT and the output transistor BCT among the elements configuring the pixel PX (sub-pixel SP). FIG. 5 shows a structure including the pixel selection transistor SST among the elements configuring the pixel PX.

As shown in FIG. 4, the display panel 2 comprises an insulating base 20, insulating layers 21, 22, 23, 24, 25, and 26, a resin layer 27, and a coating layer 28. The insulating base 20 is glass, for example, but may also be a flexible resin substrate such as polyimide.

As shown in FIG. 5, on the insulating base 20, a first shield SLD1 is provided to shield a part of the pixel circuit PC. The first shield SLD1 and the insulating base 20 are covered with the insulating layer 21. A pair of first gate electrodes GE1*a* and GE1*b* shown in FIG. 5, and a second gate electrode GE2 and a third gate electrode GE3 shown in FIG. 4 are provided on the insulating layer 21. The gate electrodes GE1*a*, GE1*b*, GE2, and GE3 and the insulating layer 21 are covered by the insulating layer 22.

A first semiconductor layer SC1 shown in FIG. 5 and a second semiconductor layer SC2 shown in FIG. 4 are provided on the insulating layer 22. The semiconductor layers SC1 and SC2 and the insulating layer 22 are covered by the insulating layer 23. A first electrode E1 and a pair of second shields SLD2*a* and SLD2*b* shown in FIG. 5 and a second electrode E2 and a third electrode E3 shown in FIG. 4 are provided on the insulating layer 23. For example, the first electrode E1 is part of the video line VL, and the second shield SLD2*a* is connected to the first electrode E1.

The first electrode E1 is in contact with the first semiconductor layer SC1 through a contact hole h1 that penetrates the insulating layer 23. The first semiconductor layer SC1 is in contact with the second gate electrode GE2 through the second shield SLD2*b* in a contact hole h2 formed in the insulating layer 22 and the insulating layer 23. The second electrode E2 and the third electrode E3 are in contact with the second semiconductor layer SC2 through contact holes h3 and h4, respectively, which penetrate the insulating layer 23.

The first gate electrodes GE1*a* and GE1*b* and a part of the first semiconductor layer SC1 configure the pixel selection transistor SST. The second gate electrode GE2 and a part of the second semiconductor layer SC2 configure the drive transistor DRT. The third gate electrode GE3 and another part of the second semiconductor layer SC2 configure the output transistor BCT. Although not shown in FIG. 4 and FIG. 5, the reset transistor RST described above is also formed by the same layer configuration as the pixel selection transistor SST, the drive transistor DRT, and the output transistor BCT.

The first electrode E1, the second electrode E2, the third electrode E3, the second shields SLD2*a* and SLD 2*b*, and the insulating layer 23 are covered by the insulating layer 24. As shown in FIG. 4, a conductive layer CL1 is provided on the insulating layer 24. The conductive layer CL1 and the insulating layer 24 are covered by the insulating layer 25.

Conductive layers CL2 and CL3 are provided on the insulating layer 25. The conductive layer CL2 is connected to the third electrode E3 through a contact hole h5 that penetrates the insulating layers 24 and 25. The conductive layer CL3 is in contact with the conductive layer CL1 through contact a hole h6 that penetrates the insulating layer 25.

The conductive layers CL2 and CL3 and the insulating layer 25 are covered by the insulating layer 26. A pixel electrode PE and a contact electrode CON are provided on the insulating layer 26. The pixel electrode PE is in contact with the conductive layer CL2 through a contact hole h7 that penetrates the insulating layer 26. The contact electrode CON is in contact with the conductive layer CL3 through a contact hole h8 that penetrates the insulation layer 26.

A connection layer LA1 is provided on the pixel electrode PE, and a connection layer LA2 is provided on the contact electrode CON. The light-emitting element 10 is provided on the connection layer LA1. The light-emitting element 10 includes an anode AN, a cathode CA, and a light-emitting layer LI disposed between the anode AN and the cathode CA. The light-emitting layer LI emits light in response to a potential difference between the anode AN and the cathode CA. The anode AN is in contact with a top surface of the connection layer LA1.

The resin layer 27 covers the pixel electrode PE, the contact electrode CON, the connection layers LA1 and LA2, and the insulating layer 26, and also fills gaps between a plurality of light-emitting elements 10. The cathode CA is exposed from the resin layer 27.

The resin layer 27 is covered by a common electrode CE. The common electrode CE is in contact with the connection layer LA2 through a contact hole h9 provided in the resin layer 27. The common electrode CE is also in contact with the cathode CA. The common electrode CE is covered by the coating layer 28.

The insulating layers 21, 22, 23, and 25 are made of an inorganic insulating material such as silicon oxide (SiO) or silicon nitride (SiN). The insulating layers 24 and 26 are made of an organic insulating material such as photosensitive acrylic resin. The insulating layers 24 and 26 are thicker than the insulating layers 21, 22, 23, and 25, and function as a planarization layer. The coating layer 28 is made of, for example, parylene (polyparaxylene) or silicon having inorganic siloxane bonds in the main chain and organic bonds in the side chains.

The first gate electrodes GE1a and GE1b, the second gate electrode GE2, the third gate electrode GE3, the first electrode E1, the second electrode E2, the third electrode E3, the first shield SLD1, the second shields SLD 2a and SLD2b, the conductive layers CL2 and CL3, the pixel electrode PE, and the contact electrode CON are made of metallic materials, and have light-shielding properties. The first shield SLD1 may be made of a light-shielding material other than metal, such as black resin. The conductive layer CL1 and the common electrode CE are made of a transparent conductive material such as indium tin oxide (ITO). The connection layers LA1 and LA2 are made of solder, for example.

The video signal Vsig is supplied to the first electrode E1 via the video line VL described above. The high potential Pvdd is supplied to the second electrode E2 via the power line PL1 described above. This high potential Pvdd is supplied to the anode AN of the light-emitting element 10 via the output transistor BCT, the drive transistor DRT, the third electrode E3, the conductive layer CL2, the pixel electrode PE, and the connection layer LA1.

The low potential Pvss is supplied to the common electrode CE via the power line PL2 described above. The low potential Pvss is also supplied to the cathode CA of the light-emitting element 10, which is in contact with the common electrode CE. The low potential Pvss is also supplied to the conductive layer CL1 via the connection layer LA2, the contact electrode CON, and the conductive layer CL3. The conductive layer CL1, together with the conductive layer CL2, etc., forms the auxiliary capacitance Cad described above.

As can be seen from FIG. 4 and FIG. 5, most of the part of the pixel circuit PC including the pixel selection transistor SST, the drive transistor DRT, the output transistor BCT, and the reset transistor RST, etc., is located between the light-emitting element 10 and the insulating base 20 in the third direction Z.

FIG. 6 is a schematic plan view of a part of the elements included in the pixel PX. In the present embodiment, a case in which the pixel PX includes three sub-pixels SPa, SPb, and SPc is assumed. The sub-pixel SPa displays red, the sub-pixel SPb displays green, and the sub-pixel SPc displays blue. However, the pixel PX may include sub-pixels that display other colors such as white. The number of sub-pixels SP included in the pixel PX is not limited to three.

The sub-pixels SPa, SPb, and SPc have the structures shown in FIG. 3 to FIG. 5. In FIG. 6, the shapes of the pixel electrode PE (PEa, PEb, PEc), the connection layer LA1 (LA1a, LA1b, LA1c), and the light-emitting element 10 (10a, 10b, 10c) of each of the sub-pixel SPa, SPb, and SPc, the shapes of the contact electrode CON and the connection layer LA2, and the locations of the contact holes h7, h8, and h9 are shown.

In the example in FIG. 6, the pixel electrode PEa of the sub-pixel SPa and the pixel electrode PEc of the sub-pixel SPc are lined up in the first direction X, and the pixel electrode PEb of the sub-pixel SPb and the contact electrode CON are lined up in the first direction X. Furthermore, the pixel electrode PEa and the pixel electrode PEb are lined up in the second direction Y, and the pixel electrode PEc and the contact electrode CON are lined up in the second direction Y. For example, the pixel electrodes PEa, PEb, and PEc and the contact electrode CON are rectangular, but not limited to this example.

The connection layer LA1a of the sub-pixel SPa is disposed on the pixel electrode PEa, the connection layer LA1b of the sub-pixel SPb is disposed on the pixel electrode PEb, the connection layer LA1c of the sub-pixel SPc is disposed on the pixel electrode PEc, and the connection layer LA2 is disposed on the contact electrode CON.

The light-emitting element 10a of the sub-pixel SPa is disposed on the connection layer LA1a, the light-emitting element 10b of the sub-pixel SPb is disposed on the connection layer LA1b, and the light-emitting element 10c of the sub-pixel SPc is disposed on the connection layer LA1c. The light-emitting element 10a is a micro-LED emitting red light, the light-emitting element 10b is a micro-LED emitting green light, and the light-emitting element 10c is a micro-LED emitting blue light.

FIG. 7 is a schematic plan view of the other elements included in the pixel PX. In this drawing, the shape of the conductive layer CL2 (CL2a, CL2b, CL2c) of the sub-pixels SPa, SPb, and SPc, the shape of the conductive layer CL3, and the locations of the contact holes h5, h6, h7, and h8 are shown.

The conductive layer CL2a of the sub-pixel SPa, the conductive layer CL2b of the sub-pixel SPb, and the conductive layer CL2c of the sub-pixel SPc are located under the pixel electrodes PEa, PEb, and PEc shown in FIG. 6, respectively.

In the example of FIG. 7, the pixel PX further comprises a line WLa extending in the first direction X and a line WLb extending in the second direction Y. These lines WLa and WLb are connected to each other and are formed by the conductive layer CL3.

FIG. 8 is a schematic plan view of further other elements included in the pixel PX. In this drawing, a metallic conductive material (dot portion) disposed in a first layer between the insulating layers 21 and 22 in FIG. 4 and FIG. 5, a semiconductor material (dashed portion) disposed in a second layer between the insulating layers 22 and 23, a metallic conductive material (shaded area) disposed in a third layer between the insulating layers 23 and 24, a light-shielding material (solid line portion with no pattern) disposed in a fourth layer between the insulating base 20 and the insulating layer 21, and contact holes leading to the first to the third layers are shown.

The conductive material disposed in the first layer includes the scanning lines Grg, Gbg, and Gsg. The semiconductor material disposed in the second layer includes the semiconductor layers SC1 and SC2. The conductive material disposed in the third layer includes the video line VL (VLa, VLb, VLc) that supplies the video signal Vsig to the sub-pixels SPa, SPb, and SPc, respectively, the power line PL1 (PL1a, PL1b, PL1c) that supplies the high potential Pvdd to the sub-pixels SPa, SPb, and SPc, respectively, and the reset line SR (SRa, SRb, SRc) that supplies the reset signal Vrst to the sub-pixels SPa, SPb, and SPc, respectively.

In the example shown in FIG. 8, the video line VLa, the reset line SRa, the power line PL1a, the video line VLb, the reset line SRb, the power line PL1b, the video line VLc, the reset line SRc, and the power line PL1c are lined up in this order in the first direction X. In the sub-pixel SPa, an interval between the reset line SRa and the power line PL1a in the first direction X is larger than an interval between the video line VLa and the reset line SRa in the first direction X. The same applies for the other sub-pixels SPb and SPc.

In the example of FIG. 8, the video lines VLa, VLb, and VLc, the power lines PL1a, PL1b, and PL1c, and the reset lines SRa, SRb, and SRc extend parallel to the second direction Y as a whole. The pixel circuit PCa of the sub-pixel SPa is disposed between the video line VLa and the power line PL1a. The pixel circuit PCb of the sub-pixel SPb is disposed between the video line VLb and the power line PL1b. The pixel circuit PCc of the sub-pixel SPc is disposed between the video line VLc and the power line PL1c.

FIG. 9 is a schematic plan view in which the pixel circuit PCa shown in FIG. 8 is enlarged. The detailed structure of the pixel circuit PCa is explained below with reference to FIG. 9. The structures of the pixel circuits PCb and PCc are the same as that of pixel circuit PCa.

As shown in FIG. 9, the scanning line Gsg has the first gate electrodes GE1a and GE1b between the video line VLa and the power line PL1a. In addition, the second gate electrode GE2 is disposed in a region enclosed by the scanning lines Gbg and Gsg. These first gate electrodes GE1a and GE1b and the second gate electrode GE2 are disposed in the first layer between the insulating layers 21 and 22 as also shown in FIG. 5.

In the example of FIG. 9, a part of the video line VLa in the vicinity of the scanning line Gsg corresponds to the first electrode E1. The first semiconductor layer SC1 includes a portion extending in the first direction X and intersecting the first gate electrode GE1a and a portion extending in the second direction Y and intersecting the first gate electrode GE1b.

One end of the first semiconductor layer SC1 is connected to the first electrode E1 through the contact hole h1 shown in FIG. 5. The other end of the first semiconductor layer SC1 is connected to the second gate electrode GE2 through the contact hole h2 shown in FIG. 5. The pixel selection transistor SST is configured by the first gate electrodes GE1a and GE1b and the first semiconductor layer SC1.

The second electrode E2 protrudes from the power line PL1a toward the reset line SRa between the scanning lines Grg and Gbg. The scanning line Gbg has the third gate electrode GE3 between the reset line SRa and the power line PL1a. An island-shaped third electrode E3 is disposed in a region enclosed by the scanning lines Grg and Gsg, the reset line SRa, and the power line PL1a. The second electrode E2 and the third electrode E3 are disposed in the third layer between the insulating layers 23 and 24 as also shown in FIG. 4.

The second semiconductor layer SC2 is disposed between the reset line SRa and the power line PL1a. The second semiconductor layer SC2 has a first portion P1, and a second portion P2 and a third portion P3 extending from the first portion P1 in the second direction Y.

The second portion P2 intersects the second gate electrode GE2 and the third gate electrode GE3. The distal end of the second portion P2 is connected to the second electrode E2 through the contact hole h3 also shown in FIG. 4. The drive transistor DRT is configured by the second gate electrode GE2 and a part of the second portion P2. The output transistor BCT is configured by the third gate electrode GE3 and another part of the second portion P2.

The scanning line Grg has two fourth gate electrodes GE4a and GE4b between the reset line SRa and the power line PL1a. The reset line SRa has a fourth electrode E4. The third portion P3 of the second semiconductor layer SC2 intersects the fourth gate electrodes GE4a and GE4b. The distal end of the third portion P3 is connected to the fourth electrode E4 through a contact hole h10. The contact hole h10 penetrates the insulating layer 23 shown in FIG. 4. The reset transistor RST is configured by the fourth gate electrodes GE4a and GE4b and third portions P3.

The first portion P1 of the second semiconductor layer SC2 is connected to the third electrode E3 through the contact hole h4 also shown in FIG. 4. The third electrode E3 faces most of the second gate electrode GE2 and, together with the second gate electrode GE2, forms the holding capacitance Cs shown in FIG. 3. At a location where the third electrode E3 and the second gate electrode GE2 overlap, the contact hole h5 also shown in FIG. 4 and FIG. 7 is provided.

In a case where the control signal SG is supplied to the first gate electrodes GE1a and GE1b via the scanning line Gsg, the video signal Vsig of the video line VLa is supplied to the second gate electrode GE2 via the first semiconductor layer SC1. As a result, a voltage corresponding to the video signal Vsig is supplied from the power line PL1a to the light-emitting element 10a via the second semiconductor layer SC2, etc.

The first semiconductor layer SC1 includes channel regions R1a and R1b intersecting the first gate electrodes GE1a and GE1b. In the example of FIG. 9, the first shield SLD1 has a width larger than the first semiconductor layer SC1 and is bent in the same manner as the first semiconductor layer SC1 to overlap the entire first semiconductor layer SC1 including the channel regions R1a and R1b. The first shield SLD1 also overlaps the contact holes h1 and h2, a part of the video line VLa including the first electrode E1, a part of the reset line SRa, and a part of the second gate electrode GE2.

The first shield SLD1 may be in other shapes as long as it overlaps at least the channel regions R1a and R1b. For example, a pair of first shields SLD1 overlapping the channel regions R1a and R1b, respectively, may be disposed spaced apart.

In the vicinity of the first semiconductor layer SC1, the second shields SLD2a and SLD2b shown in FIG. 5 are further disposed. The second shields SLD2a and SLD2b have light-shielding properties and face the first shield SLD1 through the first semiconductor layer SC1. The second shield SLD2a protrudes from the video line VLa in the first direction X. The second shield SLD2b is provided in an island shape in the vicinity of the contact hole h2.

The second shield SLD2a overlaps most of the channel region R1a. The second shield SLD2b overlaps most of the channel region R1b and the contact hole h2. The second shields SLD2a and SLD2b may overlap the entire channel regions R1a and R1b, respectively.

The reset line SRa has a bent portion B that is bent to avoid the second shield SLD2a. The bent portion B protrudes toward the power line PL1a, and intersects the first semiconductor layer SC1 and the first shield SLD1.

The second portion P2 of the second semiconductor layer SC2 includes a channel region R2 that intersects the second gate electrode GE2 and a channel region R3 that intersects the third gate electrode GE3. In the example in FIG. 9, the entire channel region R2 overlaps the third electrode E3. Also, most of the channel region R3 overlaps the third electrode E3. The third electrode E3 may overlap the entire channel region R3.

The third portion P3 of the second semiconductor layer SC2 includes channel regions R4a and R4b intersecting the fourth gate electrodes GE4a and GE4b, respectively. In the vicinity of the third portion P3, third shields SLD3a and SLD3b protruding from the reset line SRa in the first direction X are disposed. The fourth electrode E4 protrudes from the third shield SLD3a. The third shield SLD3a has light-shielding properties and overlaps most of the channel region R4a. The third shield SLD3b has light-shielding properties and overlaps most of the channel region R4b. The third shields SLD3a and SLD 3b may overlap the entire channel regions R4a and R4b, respectively.

The display device 1 using the light-emitting element 10, which is a micro-LED as in the present embodiment, can realize a display with a wide viewing angle and high luminance. On the other hand, when the display device 1 has a wide viewing angle, light can also be emitted from the light-emitting element 10 to the insulating base 20 side (back side direction). Such light may enter a channel region of a transistor in the pixel circuit PC directly or by being reflected by the surface of the insulating base 20, etc., and cause light leakage current to occur in the transistor. The light leakage current becomes a factor of reducing the luminance of the display device 1.

In particular, in the pixel circuit PC according to the present embodiment, while the pixel selection transistor SST is turned off, the second gate electrode GE2 connected to the transistor is floating. Therefore, the light leakage current in the pixel selection transistor SST easily affects the display quality.

The pixel selection transistor SST has a bottom gate structure as shown in FIG. 5. Therefore, part of the reflected light on the surface of the insulating base 20, etc. is blocked by the first gate electrodes GE1a and GE1b. However, when the light-emitting element 10 emits light with a wide viewing angle and high luminance, part of the reflected light may reach the channel regions R1a and R1b of the first semiconductor layer SC1.

In this regard, in the present embodiment, the first shield SLD1 is disposed between the first semiconductor layer SC1 and the insulating base 20, and this first shield SLD 1 overlaps both channel regions R1a and R1b. This allows the light leakage current caused by reflected light entering the backside of the channel regions R1a and R1b to be suppressed. As a result, the display device 1 can achieve high luminance.

In addition, the first shield SLD1 overlaps the entire first semiconductor layer SC1. In a case where the first shield SLD1 overlaps a part of the first semiconductor layer SC1 and does not overlap other portions, a step caused by the first shield SLD1 occurs in the first semiconductor layer SC1, and the first semiconductor layer SC1 may be damaged. In contrast, in a case where the first shield SLD1 overlaps the entire first semiconductor layer SC1, the step caused by the first shield SLD1 will not occur in the first semiconductor layer SC1.

In the present embodiment, the second shields SLD2a and SLD2b are disposed on the upper surface side of the channel regions R1a and R1b. These second shields SLD2a and SLD2b also suppress light from entering the upper surface side of the channel regions R1a and R1b. In addition, the second shields SLD2a and SLD2b shield the potential from above the first semiconductor layer SC1, thereby, allowing the effect of the potential on the operation of the pixel selection transistor SST to be suppressed.

In the present embodiment, the channel region R2 of the drive transistor DRT and the channel region R3 of the output transistor BCT overlap the third electrode E3, and the channel regions R4a and R4b of the reset transistor RST overlap the third shields SLD3a and SLD3b. These allow the drive transistor DRT, the output transistor BCT, and the reset transistor RST to be shielded from the potential and light from above.

In addition to the above, various other suitable effects can be obtained from the present embodiment.

Note that, in the present embodiment, a case in which the first shield SLD1 is provided for the pixel selection transistor SST is exemplified. However, the first shield SLD1 may be further provided for the drive transistor DRT, the output transistor BCT, and the reset transistor RST.

Second Embodiment

In the first embodiment, a case in which the pixel circuit PC includes four transistors (SST, DRT, BCT, and RST) is exemplified. In the present embodiment, a configuration of a case in which the pixel circuit PC includes five transistors is disclosed.

FIG. 10 shows an example of an equivalent circuit of a sub-pixel SP in the present embodiment. In this equivalent circuit, a pixel circuit PC further comprises an initialization transistor IST. A gate electrode of the initialization transistor IST is connected to a scanning line Gig. A source electrode of the initialization transistor IST is connected to an initialization line SI. A drain electrode of the initialization transistor IST is connected to a gate electrode of a drive transistor DRT. In the present embodiment, an initialization signal Vini is supplied to the initialization line SI.

The initialization transistor IST is turned on and off by a control signal IG supplied from the scanning line Gig to switch connection and disconnection between the pixel circuit PC and the initialization line SI. In other words, when the initialization transistor IST is turned on, the initialization signal Vini is taken into the pixel circuit PC and supplied to the gate electrode of the drive transistor DRT. In the example of FIG. 10, an auxiliary capacitance Cad is provided between a source electrode of the drive transistor DRT and a power line PL1.

In the pixel circuit PC with such a configuration, for example, as shown in FIG. 10, a first shield SLD1 overlapping a channel region in the same manner as the first embodiment may be provided for a pixel selection transistor SST and the initialization transistor IST. Also, the first shield SLD1 may be further provided for the drive transistor DRT, an output transistor BCT, and a reset transistor RST. Even with the configuration of the present embodiment, the same effects as in the first embodiment can be obtained.

Third Embodiment

In a third embodiment, a configuration of a case in which a pixel circuit PC includes two transistors is disclosed.

FIG. 11 shows an example of an equivalent circuit of a sub-pixel SP of the present embodiment. In this equivalent circuit, the pixel circuit PC comprises a pixel selection transistor SST and a drive transistor DRT, and does not comprise an output transistor BCT, a reset transistor RST and an initialization transistor IST. In addition, a reset line SR, a scanning line Grg, a scanning line Gig, and an auxiliary capacitance Cad are not provided.

In the pixel circuit PC with such a configuration, for example, as shown in FIG. 11, a first shield SLD1 overlapping a channel region as in the first embodiment may be provided for the pixel selection transistor SST. Also, the first shield SLD1 may be further provided for the drive transistor DRT. Even with the configuration of the present embodiment, the same effects as in the first embodiment can be obtained.

All display devices that can be designed and modified as appropriate and implemented by a person skilled in the art based on the display devices described above as embodiments of the present invention also fall within the scope of the present invention to the extent that they encompass the gist of the invention.

Those skilled in the art may conceive of various modifications within the scope of the idea of the present invention. These modifications are also considered to fall within the scope of the present invention. For example, any addition, deletion, or design modification of a component, or any addition or omission of a process, or any modification of conditions, made by a person skilled in the art to the above-described embodiment, as appropriate, is included in the scope of the invention to the extent that they encompass the gist of the invention.

In addition, other effects brought about by the aspects described in the embodiments above, which are obvious from the description herein or which can be conceived as appropriate by those skilled in the art, are naturally considered to be brought about by the present invention.

What is claimed is:

1. A display device, comprising:
an insulating base;
a light-emitting element disposed on the insulating base;
a pixel circuit including a first transistor that is disposed between the insulating base and the light-emitting element in a thickness direction of the insulating base, and that drives the light-emitting element; and
a first shield shielding a part of the pixel circuit from light, wherein
the first transistor includes a first semiconductor layer and a first gate electrode disposed between the insulating base and the first semiconductor layer in the thickness direction and intersecting the first semiconductor layer,
the first semiconductor layer is continuous,
the first shield is disposed between the insulating base and the first gate electrode in the thickness direction and overlaps a channel region where the first semiconductor layer and the first gate electrode intersect,
the first gate electrode is a pair of gate electrodes that are connected to a scanning line, the first shield overlaps both a pair of the channel regions where the first semiconductor layer and the pair of gate electrodes intersect, respectively, and
the first shield overlaps the entire first semiconductor layer.

2. The display device of claim 1, further comprising:
a second shield facing the first shield via the first semiconductor layer, wherein
the second shield overlaps the channel region.

3. The display device of claim 1, wherein
the pixel circuit further includes a second transistor including a second semiconductor layer connected to the light-emitting element and a second gate electrode intersecting the second semiconductor layer, and
the first semiconductor layer is connected to the second gate electrode.

4. The display device of claim 3, further comprising:
a video line that supplies a video signal to the pixel circuit; and
a power line to which power for the light-emitting element to emit light is supplied, wherein
the first semiconductor layer is connected to the second gate electrode and the video line,
the second semiconductor layer is connected to the light-emitting element and the power line, and
when a control signal is supplied to the first gate electrode, the video signal of the video line is supplied to the second gate electrode via the first semiconductor layer, thereby a voltage corresponding to the video signal is supplied from the power line to the light-emitting element via the second semiconductor layer.

5. The display device of claim 4, wherein the first shield overlaps a part of the video line.

6. The display device of claim 4, further comprising:
a reset line disposed between the video line and the power line and supplying a reset signal to the pixel circuit, wherein
the first shield overlaps a part of the reset line.

7. The display device of claim 6, wherein
the reset line has a bent portion protruding toward the power line, and
the first shield overlaps the bent portion.

8. The display device of claim 3, wherein the first shield overlaps a part of the second gate electrode.

* * * * *